US008456204B2

(12) United States Patent
Mika et al.

(10) Patent No.: US 8,456,204 B2
(45) Date of Patent: Jun. 4, 2013

(54) PHASE-LOCKED LOOP SYSTEMS USING ADAPTIVE LOW-PASS FILTERS IN SWITCHED BANDWIDTH FEEDBACK LOOPS

(75) Inventors: Benedykt Mika, Chandler, AZ (US); Ragu Sridhar, San Jose, CA (US); Ron Osgood, San Jose, CA (US); Rohini Abhyankar, San Jose, CA (US); Amrita Deshpande, Chandler, AZ (US)

(73) Assignee: NXP B.V., Eindhoven (NL)

( * ) Notice: Subject to any disclaimer, the term of this patent is extended or adjusted under 35 U.S.C. 154(b) by 702 days.

(21) Appl. No.: 11/993,290

(22) PCT Filed: Jun. 21, 2006

(86) PCT No.: PCT/IB2006/052018
§ 371 (c)(1),
(2), (4) Date: Apr. 21, 2011

(87) PCT Pub. No.: WO2006/137031
PCT Pub. Date: Dec. 28, 2006

(65) Prior Publication Data
US 2011/0187425 A1     Aug. 4, 2011

Related U.S. Application Data

(60) Provisional application No. 60/692,799, filed on Jun. 21, 2005.

(51) Int. Cl.
*H03L 7/06*     (2006.01)
(52) U.S. Cl.
USPC ......................................... 327/156; 327/147

(58) Field of Classification Search
USPC .................................................. 327/147, 156
See application file for complete search history.

(56) References Cited

U.S. PATENT DOCUMENTS 4,516,083 A * 5/1985 Turney ........................ 331/1 A
5,559,474 A    9/1996 Matsumoto et al.
(Continued)

FOREIGN PATENT DOCUMENTS

| CN | 1149944 A | 5/1997 |
|---|---|---|
| CN | 1409572 A | 4/2003 |
| JP | 7030416 A | 1/1995 |

OTHER PUBLICATIONS

Bishop, A. J; et al "Adaptive Phase Locked Loop for Video Signal Sampling" Proceedings of The International Symposium on Circuits and Systems. vol. 4, Conference 25, San Diego, May 10-13, 1992, pp. 1664-1667.

*Primary Examiner* — Adam Houston

(57) ABSTRACT

Methods and systems directed toward a PLL circuit including a local lock detector receiving an error signal and providing a lock signal, and a charge pump for receiving the error signal and providing a charge signal. A loop filter provides a first loop filter bandwidth and a second loop filter bandwidth. The loop filter includes a first low-pass filter configured to receive the charge and lock signals, alter a filter characteristic in response to the lock signal, and provide a first filter signal. The loop filter includes a second low-pass filter configured to receive the first filter and lock signals, alter a filter characteristic in response to the lock signal, and provide a loop filter signal. The PLL circuit includes a VCO for receiving the loop filter signal and providing an output signal, and a divider for receiving the output signal and dividing it to provide the reference signal.

10 Claims, 6 Drawing Sheets

U.S. PATENT DOCUMENTS

| | | |
|---|---|---|
| 5,783,971 A | 7/1998 | Dekker |
| 5,818,304 A * | 10/1998 | Hogeboom ................. 331/11 |
| 6,097,227 A | 8/2000 | Hayashi |
| 6,727,763 B2 | 4/2004 | Endo |
| 7,893,775 B2 * | 2/2011 | Luiz et al. ................. 331/25 |
| 2006/0091965 A1* | 5/2006 | Boerstler et al. ............ 331/17 |
| 2007/0036238 A1* | 2/2007 | Matero et al. ............. 375/296 |
| 2009/0058537 A1* | 3/2009 | Ben-Bassat ................. 331/34 |
| 2009/0086863 A1* | 4/2009 | Komninakis et al. ....... 375/346 |
| 2009/0086864 A1* | 4/2009 | Komninakis et al. ....... 375/346 |
| 2009/0243735 A1* | 10/2009 | Luiz et al. ................. 331/1 A |
| 2011/0148489 A1* | 6/2011 | August et al. ............. 327/159 |
| 2011/0187425 A1* | 8/2011 | Mika et al. ................ 327/157 |
| 2011/0292011 A1* | 12/2011 | Lee .......................... 345/208 |
| 2012/0082151 A1* | 4/2012 | Liu et al. .................. 370/342 |
| 2012/0086491 A1* | 4/2012 | Scouten et al. ............ 327/295 |
| 2012/0119801 A1* | 5/2012 | Hsieh et al. ............... 327/156 |

\* cited by examiner

PHASE-LOCKED LOOP SYSTEMS USING ADAPTIVE LOW-PASS FILTERS IN SWITCHED BANDWIDTH FEEDBACK LOOPS

The present invention relates generally to phase-locked loops and, more particularly, to phase locked loops using variable bandwidth switching and adaptive low-pass filters.

A phase-locked loop (PLL) is a circuit that generates a periodic output signal having a constant phase relationship with respect to a periodic input signal. PLLs are widely used in many types of measurement, microprocessor, and communication applications. PLL designers often have a major challenge with regard to the simultaneous achievement of fine output resolution (narrow channel spacing), fast lock time, and low jitter. This can be particularly difficult because the low loop bandwidth needed to reduce jitter and improve loop stability phase margin increases PLL locking time.

A PLL is typically used to generate an output signal after acquiring the frequency and the phase of an input signal for purposes of synchronization. Although the frequency of the output signal is ultimately locked onto the frequency of the input signal, there exists a static phase error between the input signal and the output signal. A Phase Frequency Detector (PFD) is used to compare the phase error and frequency between the input and output signals. The trains of the pulses generated by the PFD are proportional to the phase error and provided to a charge pump, the output of which is integrated in a loop filter, whose output controls a Voltage-Controlled Oscillator (VCO). An output signal from the VCO is provided to a divide by N circuit, whose output is used as feedback to the phase comparator. Eventually, the output signal from the VCO will lock onto the input signal with a static phase error relative to the input signal.

One challenge to the operation of phase-locked loops involves the fast locking onto an input signal over a wide bandwidth with precise tracking after lock is achieved. These and other limitations present challenges to the implementation of phase-locked loops.

Various aspects of the present invention are directed to methods and arrangements for locking the phase of an output signal to the phase of an input signal in a manner that addresses and overcomes the above-mentioned issues.

Consistent with one example embodiment, the present invention is directed to a communications approach involving locking the phase of an output signal to the phase of an input signal. The method involves determining a phase error between the input signal and the output signal. A noise characteristic of the input signal is determined. The loop characteristics of a phase-locked loop (PLL) are modified using both the determined phase error and the determined noise characteristic to adapt a low-pass filter in the phase-locked loop from a first transfer function to a second transfer function.

Consistent with another example embodiment, the present invention is directed to a phase-locked loop (PLL) circuit having a phase detector for comparing the phase of a reference signal and an input signal, and for providing an error signal in response to a difference in phase between the reference signal and the input signal. The PLL circuit includes a local lock detector for receiving the error signal and providing a lock signal, and a charge pump for receiving the error signal and providing a charge signal. A loop filter is configured to provide one of a first loop filter bandwidth and a second loop filter bandwidth, the second loop filter bandwidth being more narrow than the first loop filter bandwidth, wherein the loop filter provides the first loop filter bandwidth during a first phase of operation of the PLL circuit, and the loop filter provides the second loop filter bandwidth during a second phase of operation of the PLL circuit. The loop filter includes a first low-pass filter configured to receive the charge signal and the lock signal, and configured to alter a filter characteristic in one or both of the first phase of operation and the second phase of operation of the PLL circuit in response to the lock signal, and to provide a first filter signal. The loop filter further includes a second low-pass filter configured to receive the first filter signal and the lock signal, and configured to alter a filter characteristic in one or both of the first phase of operation and the second phase of operation of the PLL circuit in response to the lock signal, and to provide a loop filter signal. The PLL circuit includes a voltage controlled oscillator (VCO) for receiving the loop filter signal and providing an output signal, and a divider for receiving the output signal and dividing the output signal to provide the reference signal.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

The invention may be more completely understood in consideration of the following detailed description of various embodiments of the invention in connection with the accompanying drawings, in which.

Figure 1:
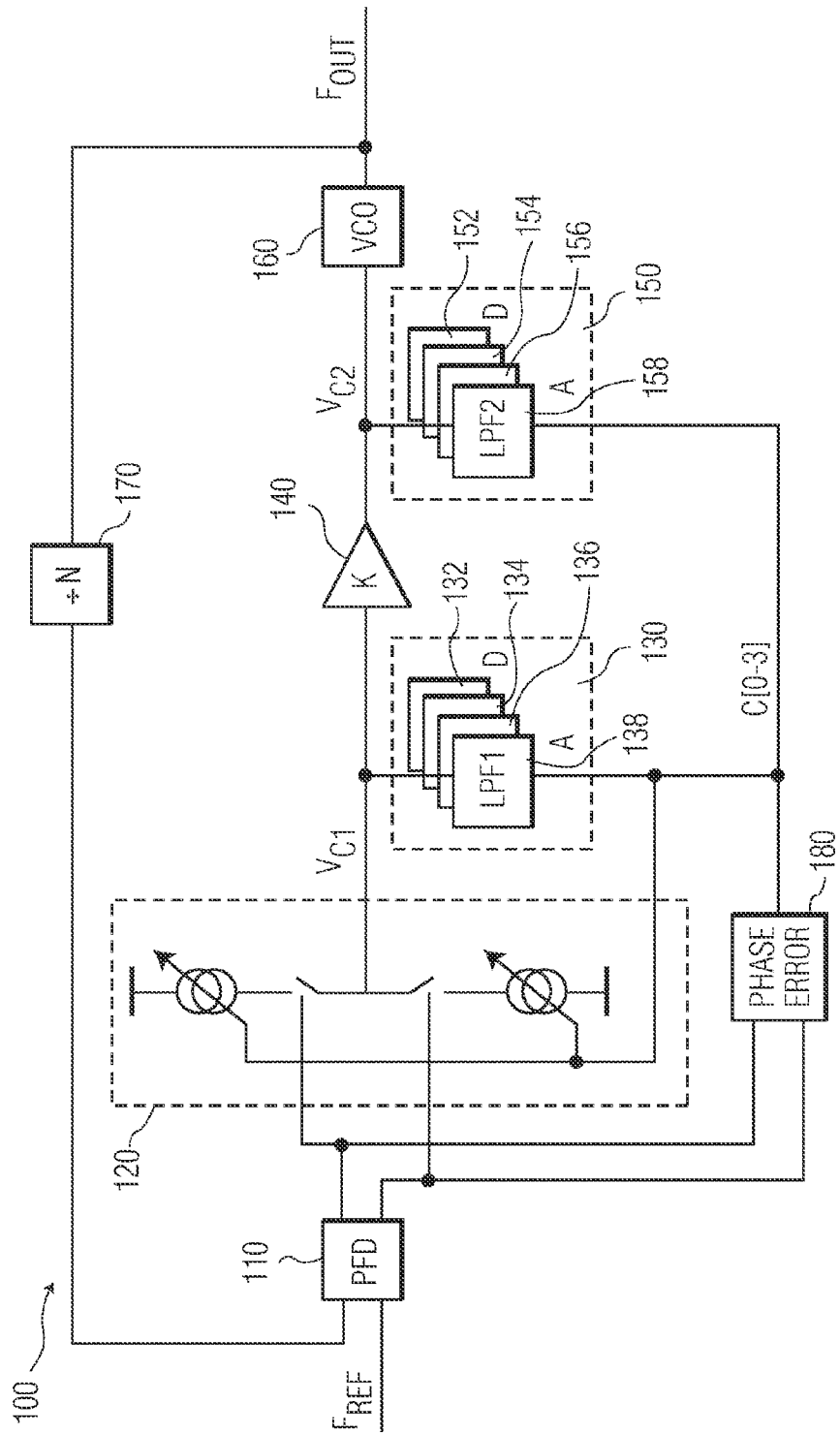
FIG. 1 is block diagram of a phase locked loop using variable bandwidth switching and adaptive low-pass filters, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving electronic communications, frequency multiplication, frequency tracking, signal synthesis, and other approaches using active feedback and/or control. While the present invention is not necessarily limited to such applications, an appreciation of various aspects of the invention is best gained through a discussion of examples in such an environment.

According to an example embodiment of the present invention, a communications approach involves locking the phase of an output signal to the phase of an input signal. The method involves determining a phase error between the input signal and the output signal. A noise characteristic of the input signal is determined. The loop characteristics of a phase-locked loop (PLL) are modified using both the determined phase error and the determined noise characteristic to adapt a low-pass filter in the phase-locked loop from a first transfer function to a second transfer function.

PLL frequency synthesizers are important building blocks in communication and computing systems. Frequency translation in radio-frequency (RF) transceiver circuits and clock generation in computing systems both typically use accurate, high performance PLL systems. The phase-noise of the PLL is the amount the source contributes to the clock instability for entire on-chip frequency distribution in the computing system. Therefore, reducing the PLL phase-noise is a desirable element in any design.

The phase-noise performance of a PLL synthesizer depends on both individual performance parameters of portions of the system, denoted as blocks, and overall PLL system behavior. Typically, a PLL with a broadband low-pass filter (LPF) is characterized as having a fast acquisition block, but in which the noise performance may be compromised. Therefore, to combine the high performance PLL with very short acquisition time, PLLs in accordance with the present invention use a PLL with adaptive LPF and variable bandwidth switching.

In accordance with one example embodiment, the proposed PLL architecture of the present invention integrates a third-order type-II PLL, a fourth order type-II PLL, and an adaptive LPF. A type-II fourth-order PLL implementation may be chosen to ensure sufficient noise and spurious signal suppression at steady state operation. A type-II third-order PLL implementation may be chosen to ensure PLL fast acquisition below 1 microsecond. In addition, the adaptive LPF may be chosen to eliminate abrupt bandwidth change during the transition phase. For example, a PLL system in accordance with the present invention may switch from a 10 megahertz third-order to a one megahertz fourth-order system. A simplified PLL block diagram in accordance with the present invention is shown in FIG. 1.

FIG. 1 illustrates a PLL system 100 including a phase frequency detector (PFD) 110, a phase error detector 180, a charge pump 120, a first adaptive LPF 130 (designated LPF1 herein), a second adaptive LPF 150, (designated LPF2 herein), a voltage controlled oscillator 160, and a frequency divide circuit 170. As will be described further below, the LPF 130 may have any number of RC elements switchable to produce filters 132, 134, 136, and 138. The designation of four filters 132, 134, 136, and 138 is for purposes of illustration only, and not by way of limitation. Similarly, the LPF 150 may have any number of RC elements switchable to produce filters 152, 154, 156, and 158. An operational transconductance amplifier (OTA) 140 provides a gain stage (designated as K) between LPF 130 and LPF 150.

Figure 2:
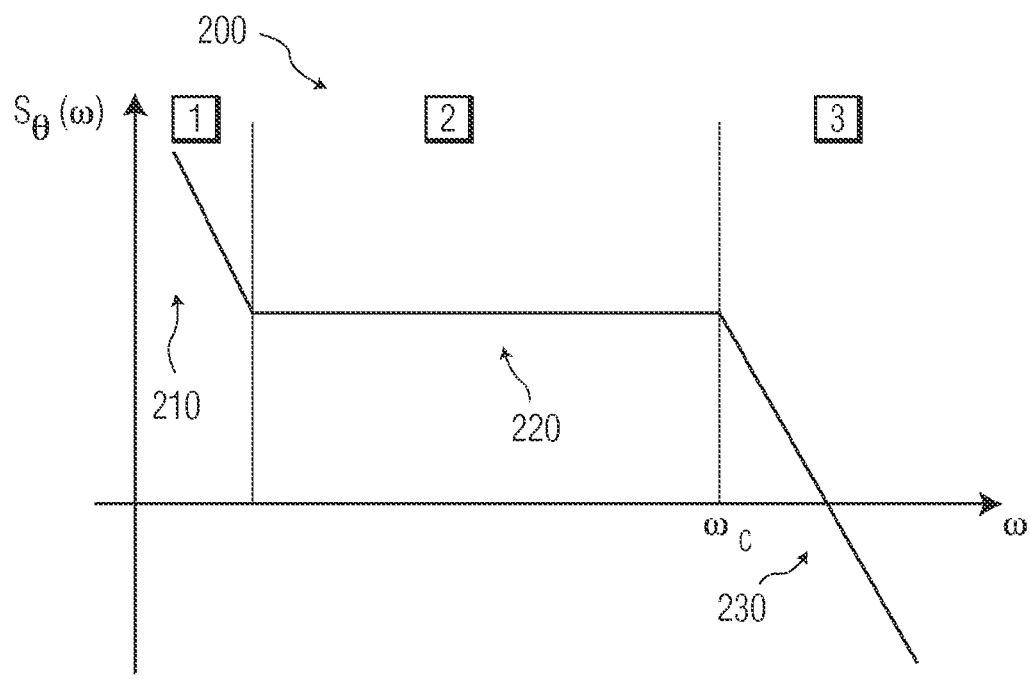
FIG. 2 is a graph of a typical (ideal) PLL output phase-noise plot.

Noise is a common issue that arises when dealing with circuitry in accordance with the present invention. The PLL system 100 bandwidth and its order determine the total PLL system 100 noise-shape. A typical single side-band (SSB) phase-noise graph 200 of the PLL system 100 is shown in FIG. 2. The phase-noise performance exhibits three regions.

A first phase-noise region 210 may be dominated by the reference oscillator noise. A second region 220 is defined as the PLL close-in noise. Second region 220 may be dominated by a noise of reference signal, CP, and the divider noise. A third region 230, beyond the PLL bandwidth, is practically the voltage controlled oscillator (e.g. voltage controlled oscillator 160), phase-frequency detector (e.g. frequency divide circuit 170), and power supply noise. To achieve an acceptable noise performance, all regions may be studied, and the loop parameters may be considered carefully to reduce the total output phase-noise in accordance with the present invention.

Figure 3:
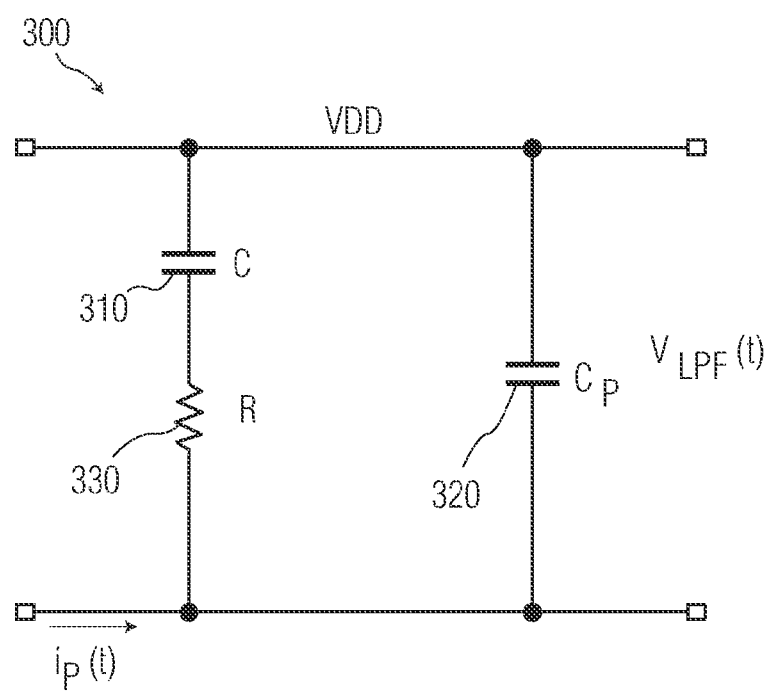
FIG. 3 is a circuit RC model of a third order low-pass filter as may be used in a type-II PLL.

To accomplish the PLL order programmability and its bandwidth within one loop system, the adaptive LPF is used in accordance with the present invention. The Loop Filter Path consists of two blocks as shown in FIG. 1, i.e. the LPF 130 and LPF 150. In LPF 130, (such as will be described further below with reference to FIG. 4), a third-order, type-II PLL with a passive filter may be constructed using the addition of charge pump 120. As an example, a passive filter 300 uses two capacitors 310, 320, and a resistor 330 as shown in FIG. 3. The impedance of passive filter 300 is given by:

$$Z_{LPF1} = \frac{1+s \cdot \tau_Z}{s \cdot (C+C_P) \cdot (1+s \cdot \tau_P)} \quad \text{(Equation 1)}$$

where $$\tau_Z = R \cdot C \text{ and } \tau_P = R \cdot \left(\frac{1}{C}+\frac{1}{C_P}\right)^{-1} \quad \text{(Equation 2)}$$

Figure 4:
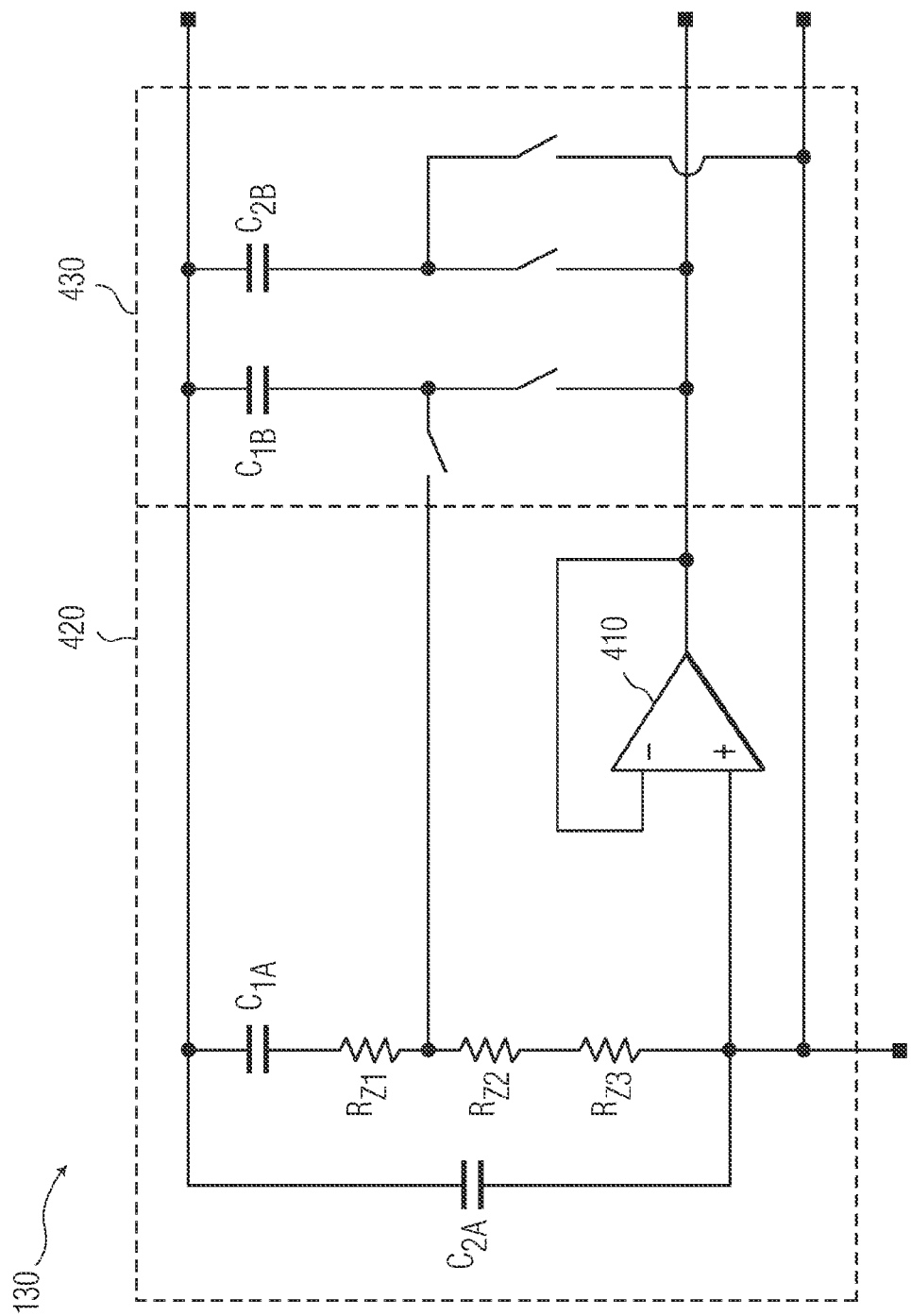
FIG. 4 is a block diagram of a circuit for an adaptive low-pass filter, according to an example embodiment of the present invention.

FIG. 3 illustrates an example of a Low Pass Filter for a 3-rd order, type-II PLL. Therefore, the programmable LPF 130 incorporates capacitors C 310 and CP 320, which are split into n sections, such as is illustrated in FIG. 4. In FIG. 4, resistors are designated as capital R, and capacitors are designated as capital C, both having suffixes designating individual elements of the circuit. A first section, designated as a block 420, includes an OTC 410 and associated capacitors and resistors as illustrated and further described below. A second section, designated as a block 430, includes switches and capacitors as will be further described with reference to FIGS. 5A through 5C, to implement adaptive low pass filtering in accordance with the present invention. Capacitance and resistance values mapping FIG. 3 to FIG. 4 are given by:

$C = C_{1A} + C_{1B} + C_{1C} + C_{1D} + \ldots$ $C_P = C_{2A} + C_{2B} + C_{2C} + C_{2D} + \ldots$ $R = R_{Z1} + R_{Z2} + R_{Z3} +$ \quad (Equation 3)

Each individual section of LPF 130 may be controlled by non-overlapping bi-phase signals (Illustrated in FIG. 5C), which are used for noiseless PLL system 100 operation during the switching of the PLL bandwidth, or its order. An example of timing of the control signals in accordance with the present invention is illustrated in FIG. 5.

Figure 5A:
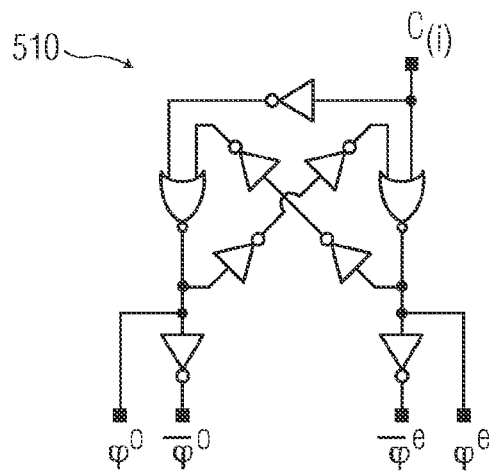
FIG. 5A is an example logic circuit useful for switching capacitors in an adaptive low-pass filter for a phase locked loop according to an example embodiment of the present invention.
Figure 5B:
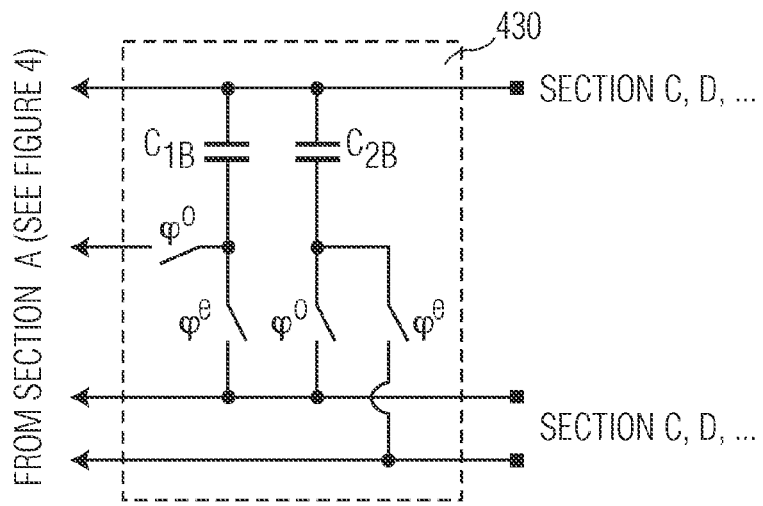
FIG. 5B is an example capacitor and switch arrangement useful for switching capacitors in an adaptive low-pass filter for a phase locked loop according to an example embodiment of the present invention.
Figure 5C:
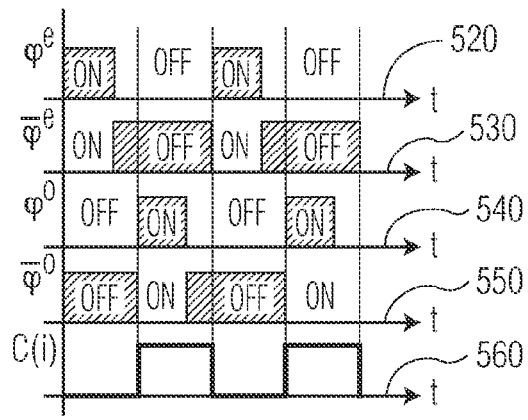
FIG. 5C is a timing diagram for an adaptive low-pass filter useful in a phase locked loop according to an example embodiment of the present invention.

In FIGS. 5A through 5C, circuitry 510 illustrates one possible embodiment for controlling switching of capacitors in and out of the LPF 130, in order to adapt the filter in accordance with the present invention. A set of switches $\phi^e$, $\overline{\phi}^e$, $\phi^o$, $\overline{\phi}^o$ are illustrated in FIG. 5B, associated with switching signals 520, 530, 540, 550 respectively in FIG. 5C, generated by circuitry 510 in FIG. 5A. A capacitance C(i) (Illustrated in FIG. 5A and associated with a signal 560 in FIG. 5C) is switched using switching signals 520, 530, 540, and 550. The block 430 in FIG. 5B is coupled as is illustrated in FIG. 4, to the block 420.

Therefore, the LPF 130 frequency response can be altered by connecting or disconnecting each RC group as illustrated in FIGS. 5A, 5B, and 5C. Each disconnected section may be controlled by the unity gain operational transconductance amplifier (OTA 410), which reflects the instantaneous charge acquired by the PLL system 100 and stored in connected sections of LPF 130. Using the reflection of the instantaneous charge acquired by the PLL system 100, the switching noise from the set of switches $\phi^e$, $\overline{\phi}^e$, $\phi^o$, $\overline{\phi}^o$ is reduced.

Figure 6:
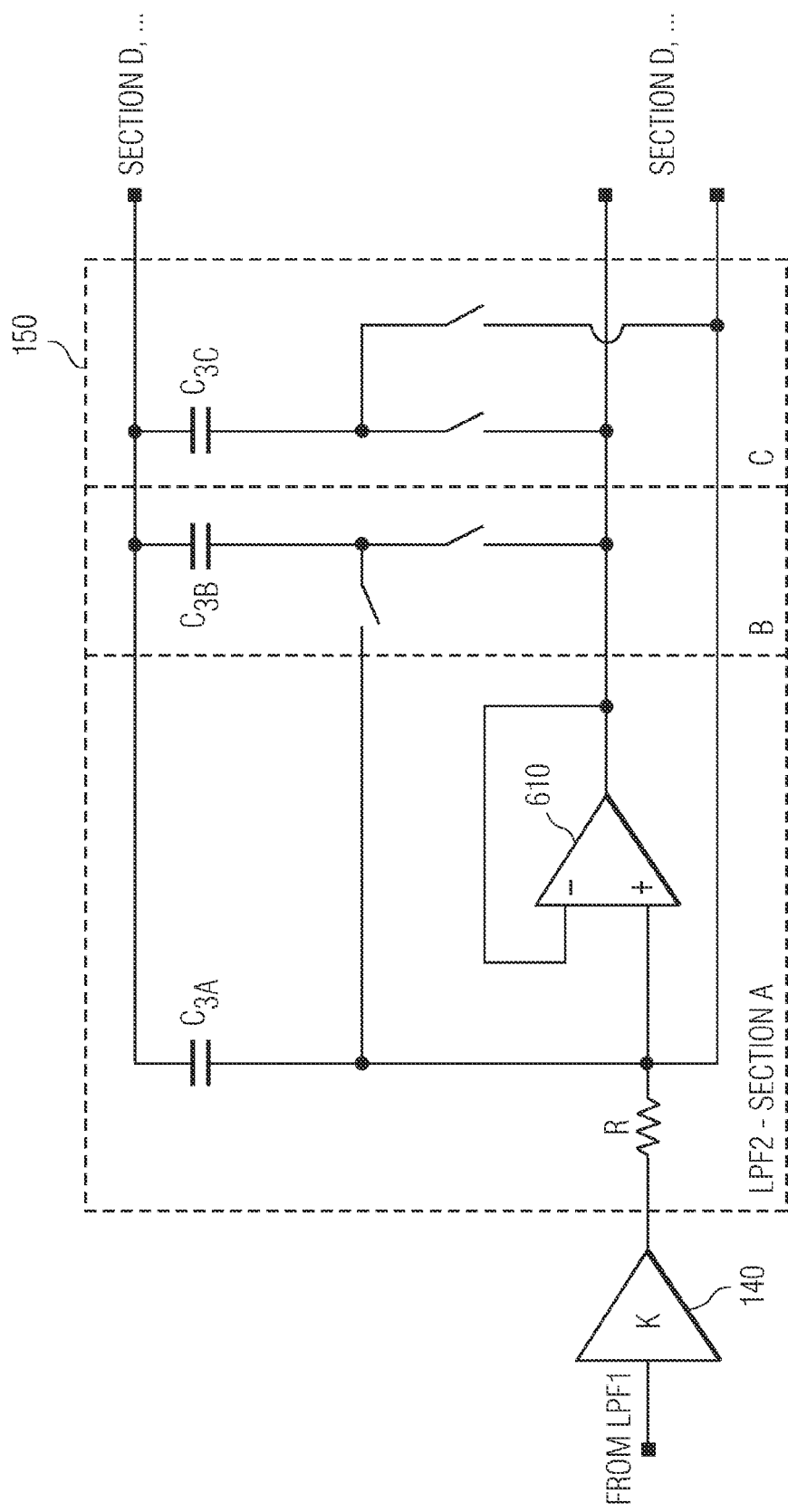
FIG. 6 is a block diagram of another circuit for an adaptive low-pass filter, according to an example embodiment of the present invention.

Referring now to FIG. 6, the overall PLL system 100 output phase-noise strongly depends on the PLL loop transfer function, as it is outlined above with respect to FIG. 2. Therefore, a third pole may be added on the top of (Equation 2), into the LPF transfer function, by means of adding the programmable LPF 150 section, including a section A, a section B, and a section C. The programmability of LPF 150 is similar in structure and control to LPF 130 section, as described above with reference to capacitance switching illustrated in FIGS. 5A, 5B, and 5C. An example implementation of the LPF2 150 with a passive filter section A is shown in FIG. 6. The resistor R in section A may be introduced, the value of resistor R representing the output resistance of gain stage K 140. Gain stage K 140 represents an arbitrary gain stage providing electrical separation between two passive networks, thereby avoiding impedance loading between the two networks. This block can be described by a gain factor K and its output impedance R. In this particular case, the output impedance R, which in combination with C3A, C3B, C3C, or C3D, defines the fourth pole location. Any number of passive filter sections may be added to the circuit, as is designated by section D in FIG. 6. Section D may be, for example, an iteration of section C, thereby adding two more switches and one more capacitor to the circuit of FIG. 6 (designated as the capacitor C3D for example).

The dynamic behavior of a PLL at startup is one of the important design parameters for consideration. The dynamic behavior of the PLL system 100 involves two different steps: frequency acquisition and phase correction. In the first step, the PLL system 100 starts from an unlocked state at power up, and achieves frequency lock to the given frequency. Therefore, to accomplish high-speed acquisition sequencing, a type-II third-order PLL may be used in accordance with the present invention, for which the open loop transfer function is given by:

$$GH(s) = \frac{I_P \cdot K_{VCO}}{2 \cdot \pi \cdot N \cdot (C_{1A} + C_{2A})} \cdot \frac{1 + s \cdot \tau_Z}{s^2 \cdot (1 + s \cdot \tau_{p1}) \cdot (1 + s \cdot \tau_{p2})} \quad \text{(Equation 4)}$$

where low-frequency zero and pole locations are defined as:

$$\tau_{p1} = (R_{Z1} + R_{Z2} + R_{z3}) \cdot \left(\frac{1}{C_{1A}} + \frac{1}{C_{2A}}\right)^{-1} \quad \text{(Equation 5)}$$

$$\tau_{p1} \gg \tau_{p2} = R \cdot C_{3A}$$

$$\tau_Z = (R_{Z1} + R_{Z2} + R_{z3}) \cdot C_{1A} \quad \text{(Equation 6)}$$

During this phase, only $C_{1A}$, $C_{2A}$ and sum of $R_{ZX}$ define the PLL system 100 dynamics. Therefore, the elements $C_{1B}$, $C_{2B}$, $C_{1C}$, $C_{2C}$, $C_{2D}$ in sections B, C, and D are working in the shadow of the main LPF, where a voltage charge is controlled by the unity gain OTA and reflects the instantaneous charge acquired by the elements $C_{1A}$, $C_{2A}$. The characteristics of the PLL system 100 open loop transfer function shaped by programmable sections of the LPF path are presented in FIG. 7.

Figure 7:
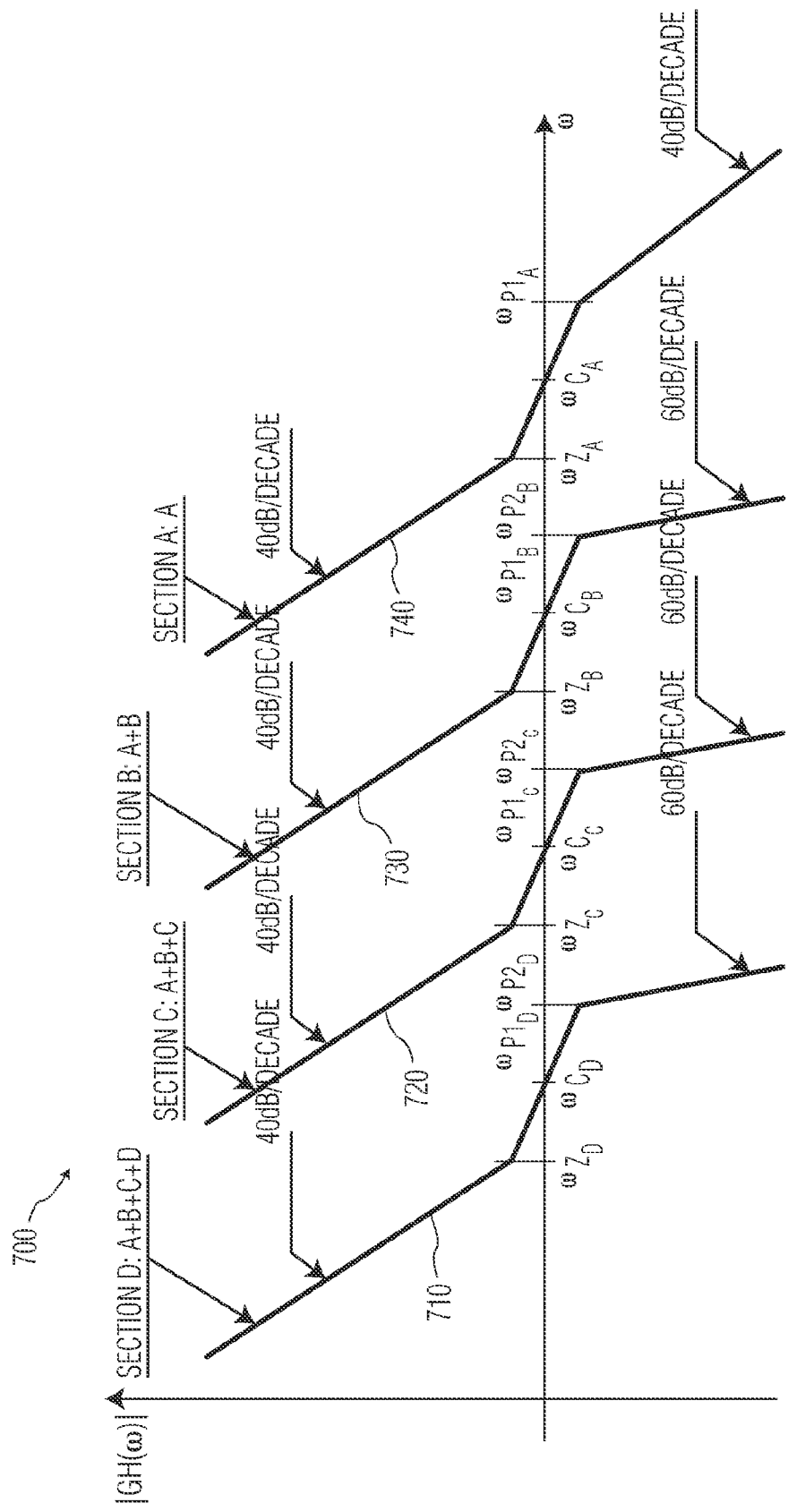
FIG. 7 is an open-loop gain Bode plot of an adaptive low-pass filter according to an example embodiment of the present invention.

In FIG. 7, a graph 700 illustrates the transfer function of the PLL system 100 over a broad bandwidth, illustrating the result of both switching the bandwidth and adapting the low-pass filters LPF1 130 and LPF2 150 in accordance with the present invention. A plot 710 illustrates the contribution to the PLL system 100 from a selection of filter center frequencies having suffixes A, B, C and D associated with both LPF1 130 and LPF2 150. A plot 720 illustrates the contribution to the PLL system 100 from a selection of A, B, and C. A plot 730 illustrates the contribution to the PLL system 100 from a selection of A and B. And a plot 740 illustrates the contribution to the PLL system 100 from a selection of only A. By switching RC segments as illustrated above, the overall PLL system 100 characteristics can be manipulated to achieve both fast lock and controlled tracking of signals.

The PLL system 100 phase-noise characteristics at steady state is an important design parameter. A system in accordance with the present invention reduces the output phase-noise of the PLL at large offset by adding an additional pole into the transfer function at the same frequency as $$\omega_P = \frac{1}{\tau_P}$$

(using Equation 2). This suppresses even more of the noise at higher offset frequencies, and may allow relaxation of the sizing of the loop parameters. Therefore, to accomplish low phase-noise operations at lock condition, the type-II fourth-order PLL may be used in accordance with the present invention, for which the open loop transfer function is given by:

$$GH(s) = \frac{I_P \cdot K_{VCO}}{2 \cdot \pi \cdot N \cdot (C_{1A} + C_{2A})} \cdot \frac{1 + s \cdot \tau_Z}{s^2 \cdot (1 + s \cdot \tau_{p1}) \cdot (1 + s \cdot \tau_{p2})} \quad \text{(Equation 7)}$$

where low-frequency zero and pole locations are defined as:

$$\tau_{p1} = (R_{Z1} + R_{Z2} + R_{z3}) \cdot \left(\frac{1}{C_{1A}} + \frac{1}{C_{2A}}\right)^{-1} \quad \text{(Equation 8)}$$

$$\tau_{p1} = \tau_{p2} = R \cdot C_{3A} \quad \text{(Equation 9)}$$

$$\tau_Z = (R_{Z1} + R_{Z2} + R_{z3}) \cdot C_{1A} \quad \text{(Equation 10)}$$

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, applications other than frequency multiplication may be amenable to implementation using similar approaches. In addition, one or more of the above example embodiments and implementations may be implemented with a variety of approaches, including digital and/or analog circuitry and/or software-based approaches. The above example embodiments and implementations may also be integrated with a variety of circuits, devices, systems and approaches including those for use in connection with memory transfer, communications, guidance control, and frequency tracking. These approaches are implemented in connection with various example embodiments of the present invention. Such modifications and changes do not depart from the true scope of the present invention that is set forth in the following claims.

What is claimed is:

1. A method for locking the phase of an output signal to the phase of an input signal, comprising:
   determining a phase error between the input signal and the output signal;
   determining a noise characteristic of the input signal; and
   modifying loop characteristics of a phase-locked loop using both the determined phase error and the determined noise characteristic to adapt a low-pass filter in the phase-locked loop from a first transfer function to a second transfer function.

2. The method of claim 1, wherein modifying the loop characteristics of the phase-locked loop comprises moving the location of a pole of the low-pass filter in response to a pre-determined noise characteristic.

3. The method of claim 1, wherein modifying the loop characteristics of the phase-locked loop comprises altering the order of a phase-locked loop transfer function in response to a pre-determined phase error.

4. The method of claim 1, wherein modifying the loop characteristics of the phase-locked loop comprises altering the order of a phase-locked loop transfer function in response to a pre-determined phase error and moving the location of a pole of the low-pass filter in response to a pre-determined noise characteristic.

5. A phase-locked loop (PLL) circuit comprising:
   a phase detector for comparing the phase of a reference signal and an input signal, and for providing an error signal in response to a difference in phase between the reference signal and the input signal;
   a local lock detector for receiving the error signal and providing a lock signal; a charge pump for receiving the error signal and providing a charge signal;
   a loop filter configured to provide one of a first loop filter bandwidth and a second loop filter bandwidth, the second loop filter bandwidth being more narrow than the first loop filter bandwidth, wherein the loop filter provides the first loop filter bandwidth during a first phase of operation of the PLL circuit, and the loop filter provides the second loop filter bandwidth during a second phase of operation of the PLL circuit, the loop filter comprising:
   a first low-pass filter configured to receive the charge signal and the lock signal, and configured to alter a filter characteristic in one or both of the first phase of operation and the second phase of operation of the PLL circuit in response to the lock signal, and to provide a first filter signal;
   a second low-pass filter configured to receive the first filter signal and the lock signal, and configured to alter a filter characteristic in one or both of the first phase of operation and the second phase of operation of the PLL circuit in response to the lock signal, and to provide a loop filter signal;
   a voltage controlled oscillator (VCO) for receiving the loop filter signal and providing an output signal; and
   a divider for receiving the output signal and dividing the output signal to provide the reference signal.

6. The circuit of claim 5, wherein the first and second low-pass filters alter the filter characteristic by altering a frequency response of the low-pass filter in response to a pre-determined level of the lock signal.

7. A device for locking the phase of an output signal to the phase of an input signal, comprising:
   a first determiner for determining a phase error between the input signal and the output signal;
   a second determiner for determining a noise characteristic of the input signal; and
   a modifier for modifying the loop characteristics of a phase-locked loop using both the determined phase error and the determined noise characteristic to adapt a low-pass filter in the phase-locked loop from a first transfer function to a second transfer function.

8. The device of claim 7, wherein the modifier comprises an element for moving the location of a pole of the low-pass filter in response to a pre-determined noise characteristic.

9. The device of claim 7, wherein the modifier comprises an element for altering the order of a phase-locked loop transfer function in response to a pre-determined phase error.

10. The device of claim 7, wherein the modifier comprises an element for altering the order of a phase-locked loop transfer function in response to a pre-determined phase error and an element for moving the location of a pole of the low-pass filter in response to a pre-determined noise characteristic.

* * * * *